(12) United States Patent
Endress et al.

(10) Patent No.: US 10,500,662 B2
(45) Date of Patent: Dec. 10, 2019

(54) DEVICE FOR FEEDING A STREAM OF HOT GAS

(71) Applicant: ERSA GmbH, Wertheim (DE)

(72) Inventors: Lothar Endress, Wertheim (DE); Hermann Beck, Wuerzburg (DE)

(73) Assignee: ERSA GMBH, Wertheim (DE)

( * ) Notice: Subject to any disclaimer, the term of this patent is extended or adjusted under 35 U.S.C. 154(b) by 249 days.

(21) Appl. No.: 14/917,081

(22) PCT Filed: Jun. 26, 2014

(86) PCT No.: PCT/EP2014/063560
§ 371 (c)(1),
(2) Date: Mar. 7, 2016

(87) PCT Pub. No.: WO2015/032517
PCT Pub. Date: Mar. 12, 2015

(65) Prior Publication Data
US 2016/0207131 A1    Jul. 21, 2016

(30) Foreign Application Priority Data
Sep. 9, 2013   (DE) .......................... 10 2013 217 952

(51) Int. Cl.
*A62C 31/02* (2006.01)
*B23K 1/012* (2006.01)
(Continued)

(52) U.S. Cl.
CPC ............ *B23K 1/012* (2013.01); *B23K 1/0016* (2013.01); *H05K 3/3494* (2013.01); *B23K 2101/42* (2018.08)

(58) Field of Classification Search
CPC .. B23K 1/012; B23K 1/0016; B23K 2201/42; H05K 3/3494
(Continued)

(56) References Cited

U.S. PATENT DOCUMENTS 1,323,999 A * 12/1919 Baker .................. A61M 11/041
188/204 R
2,608,421 A *  8/1952 Schnepp ................. E03C 1/302
15/104.33
(Continued)

FOREIGN PATENT DOCUMENTS

CN       1173801 A      2/1998
DE     39 15 778       11/1989
(Continued)

OTHER PUBLICATIONS

The International Search Report as dated Oct. 9, 2014 for International Application No. PCT/EP2014/063560.
(Continued)

*Primary Examiner* — Viet Le
(74) *Attorney, Agent, or Firm* — Quarles & Brady LLP

(57) ABSTRACT

The invention relates to a device for feeding a stream of hot gas to a printed circuit board during convection soldering in a soldering installation. The feed device comprises a nozzle plate (1) having at least one drilled hole (3), which opens into a hot gas nozzle (2) arranged on the nozzle plate (1) and having a nozzle opening (4).
The invention is defined in that the hot gas nozzle is formed by a flexible helical spring (2).
The invention permits the nozzle plate with the hot gas nozzles to be advanced right up to the printed circuit board under all peripheral conditions which occur. In particular, the printed circuit board can, for instance, be advanced right up to the nozzle plate even when a central support for the printed circuit boards or some other disruptive contour is present.
It is also possible to move the central support transversely with respect to the direction of transport of the circuit boards in the soldering installation without the printed circuit board having to be positioned at an increased distance from the
(Continued)

Figure 1:
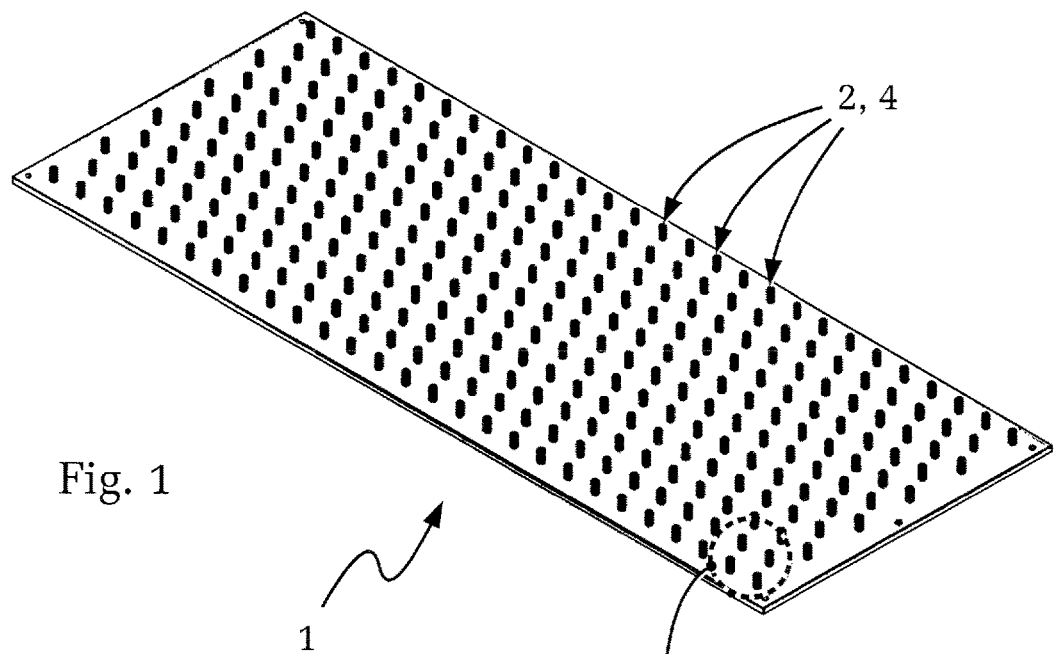

nozzle plate, since, thanks to the invention, collisions between the nozzles and the central support or some other disruptive contour do not cause damage.

7 Claims, 2 Drawing Sheets

(51) Int. Cl.
*H05K 3/34* (2006.01)
*B23K 1/00* (2006.01)
*B23K 101/42* (2006.01)

(58) Field of Classification Search
USPC ..... 239/589; 219/624, 121.5, 129, 616, 630, 219/674, 236
See application file for complete search history.

(56) References Cited

U.S. PATENT DOCUMENTS

| | | | | |
|---|---|---|---|---|
| 2,648,567 A * | 8/1953 | Brennan | B05B 7/18 | 219/628 |
| 2,874,741 A * | 2/1959 | Brancato | F16B 37/12 | 411/262 |
| 3,088,756 A * | 5/1963 | May | F16L 35/00 | 285/116 |
| 3,370,599 A * | 2/1968 | Ciaccio | B08B 9/0433 | 134/167 C |
| 3,478,967 A * | 11/1969 | Horton | A01M 7/006 | 239/169 |
| 3,959,840 A * | 6/1976 | Sato | B08B 9/045 | 15/104.33 |
| 4,257,139 A * | 3/1981 | Yeo | E03C 1/304 | 134/167 C |
| 4,420,852 A * | 12/1983 | Bowlsby | B08B 9/0433 | 134/166 C |
| 4,466,788 A * | 8/1984 | Nitta | F23Q 2/285 | 431/255 |
| 4,569,420 A * | 2/1986 | Pickett | H02G 1/08 | 184/15.1 |
| 4,644,140 A * | 2/1987 | Hillinger | B05B 1/24 | 219/421 |
| 4,771,929 A * | 9/1988 | Bahr | B23K 1/0053 | 219/85.13 |
| 4,775,775 A * | 10/1988 | Spigarelli | G05D 23/1934 | 219/508 |
| 4,813,866 A * | 3/1989 | Eun | F23Q 2/163 | 431/132 |
| 4,822,971 A * | 4/1989 | Peterson | B23K 1/002 | 219/610 |
| 4,926,028 A * | 5/1990 | Fortune | C25D 5/02 | 219/229 |
| 5,018,965 A * | 5/1991 | Ichikawa | F23Q 2/163 | 431/344 |
| 5,054,106 A * | 10/1991 | Fortune | B23K 1/012 | 174/47 |
| 5,345,061 A * | 9/1994 | Chanasyk | B23K 1/008 | 219/388 |
| 5,358,166 A * | 10/1994 | Mishina | B23K 1/008 | 228/42 |
| 5,862,561 A * | 1/1999 | Irwin | B08B 9/045 | 134/113 |
| 5,862,588 A * | 1/1999 | Heim | B23K 1/012 | 29/840 |
| 5,971,246 A | 10/1999 | Aun | | |
| 6,152,495 A * | 11/2000 | Hoffmann | F16L 37/04 | 285/148.19 |
| 6,347,734 B1 | 2/2002 | Downes | | |
| 6,508,414 B2 * | 1/2003 | Matsumoto | B05B 15/40 | 239/284.1 |
| 7,389,942 B2 * | 6/2008 | Kenyon | B05B 15/74 | 239/30 |
| 7,780,057 B2 * | 8/2010 | Kishi | B23K 3/0653 | 228/37 |
| 9,511,379 B2 * | 12/2016 | Hiyama | H05K 3/3494 | |
| 9,751,146 B2 * | 9/2017 | Kagaya | B23K 1/0016 | |
| 2002/0116090 A1 * | 8/2002 | Fischer | H05K 13/0812 | 700/245 |
| 2006/0197040 A1 * | 9/2006 | Brieske | A61M 39/28 | 251/7 |
| 2007/0210034 A1 * | 9/2007 | Mather | B23K 10/006 | 219/121.5 |
| 2009/0134142 A1 * | 5/2009 | Nakamura | B23K 1/008 | 219/420 |
| 2011/0219743 A1 * | 9/2011 | Johnson | F02K 9/52 | 60/258 |
| 2012/0088202 A1 * | 4/2012 | Willemen | B23K 1/012 | 432/221 |
| 2012/0100668 A1 | 4/2012 | Jeon et al. | | |
| 2012/0178039 A1 * | 7/2012 | Kagaya | B23K 1/0016 | 165/177 |
| 2015/0290736 A1 * | 10/2015 | Zhang | B23K 3/063 | 219/56.22 |
| 2015/0382482 A1 * | 12/2015 | Hiyama | B23K 1/008 | 228/42 |
| 2016/0050740 A1 * | 2/2016 | Zhang | B23K 10/02 | 219/121.5 |
| 2016/0052074 A1 * | 2/2016 | Hueste | B23K 1/0016 | 228/219 |

FOREIGN PATENT DOCUMENTS

| | | |
|---|---|---|
| DE | 38 79 529 T2 | 3/1993 |
| DE | 10 2011 111 489 | 5/2012 |
| EP | 0 279 604 | 3/1993 |
| EP | 1 870 191 | 12/2007 |
| GB | 2 324 058 | 10/1998 |
| WO | 99/21676 | 5/1999 |

OTHER PUBLICATIONS

The International Preliminary Report on Patentability as dated Mar. 24, 2016 for International Application No. PCT/EP2014/063560.

Eberhard Schmauch et al., Reflow Soldering of RoHS-Compliant Groups of Components in Power Electronics, Technical Journal of Advanced Packaging & Electronics Manufacturing, Mar./Apr. 2010, Published by SMT.

English Translation of first office action and search report of State Intellectual Property Office of People's Republic of China, dated Nov. 16, 2017.

* cited by examiner

DEVICE FOR FEEDING A STREAM OF HOT GAS

CROSS-REFERENCE TO RELATED APPLICATIONS

This application represents the national stage entry of PCT International Application No. PCT/EP2014/063560 filed Jun. 26, 2014 and claims priority to German Patent Application No. 10 2013 217 952.9 filed Sep. 9, 2013. The contents of both applications are hereby incorporated by reference as if set forth in their entirety herein.

The invention relates to a device for feeding a stream of hot gas to a printed circuit board.

It is known to connect, when producing printed circuit board assemblies, the components arranged on the printed circuit board to the printed circuit board by hot-air soldering.

In reflow or convection soldering installations, hot gas soldering devices fitted, for instance, with hot gas nozzles are used for this. In this respect, hot air or hot gas is blown through the hot gas nozzles to the soldering points in the area of the contact pins of the components, the solder thus being melted.

The hot gas nozzles, hereunto, may for instance be arranged on nozzle sheets or nozzle plates, wherein the nozzle sheets or nozzle plates may typically be arranged beneath, but also above the circuit boards transported through the soldering installation. Here, it is required for a good heat transfer, while the energy input is as low as possible, that the printed circuit boards are positioned at a location as close as possible to nozzle plates having the hot gas nozzles arranged thereon, in order to achieve the most direct application possible of hot gas to the soldering points in this manner.

However, in printed circuit boards whose width-thickness relation is relatively large, as well as in flexible or film-based printed circuit boards, deflections may occur in the center of the printed circuit boards as the temperature rises in a soldering machine. In order to counteract such undesired deflections, reflow or convection soldering installations commonly possess appliances for the purpose of central support of the printed circuit boards when being transported through the hot gas area. Such appliances for central support purposes commonly support the printed circuit boards at a position between the opposite lateral edges of the circuit boards. Known systems for central support purposes utilize, for instance, a circumferential rope or a circumferential chain, which, for instance, centrally supports the printed circuit boards. Revolving supporting bolts for selective support are also known.

Such appliances for the purpose of central support of printed circuit boards, however, occupy installation space in the hot gas feeding area. In particular when adjusting the central support transversely with respect to the direction of transport of the circuit boards, or also when other disruptive contours are present in the area of the circuit board surface or of the hot gas nozzles, it is additionally required that the central support or the circuit boards have a sufficient distance to the known nozzle plates having the hot gas nozzles arranged thereon. Thus, the nozzles are prevented from colliding with the central support or with any other disruptive contours when the circuit boards are transported through the hot gas area or when the central support has to be adjusted transversely with respect to the direction of transport of the circuit boards.

The associated increased distance between the nozzle plates or the outlet openings of the hot gas nozzles and the circuit board surface, however, leads to a loss of energy and to a suboptimal heat transfer onto the circuit boards or soldering points to be melted.

The present invention is accordingly based on the object of creating a device for feeding a stream of hot gas to a printed circuit board, with which the aforementioned advantages or restrictions can be overcome. In particular, a distance between the nozzle plate or the hot gas nozzles on the one hand and the circuit board surface on the other hand that is as small as possible is also to be made possible in soldering installations having a central support.

This object is attained by a device according to the teaching of claim 1. Advantageous embodiments of the invention are the subject-matter of the dependent claims.

The device for feeding a stream of hot gas in accordance with the present invention, in an initially known manner, features a nozzle plate having at least one drilled hole. In this respect, a hot gas nozzle arranged on the nozzle plate is assigned to the at least one drilled hole, in such a way that the drilled hole opens into the hot gas nozzle.

If hot gas is hence applied to the nozzle plate from the back, the same flows through the at least one drilled hole of the nozzle plate as well as through the hot gas nozzle and exits from the nozzle opening of the hot gas nozzle.

In accordance with the invention, the hot gas feed device is, however, defined in that the at least one hot gas nozzle is formed by a helical spring. Due to the hot gas nozzle being implemented as a helical spring, the hot gas nozzle can be embodied flexibly. This makes it possible that objects or groups of components, which would collide with a rigid hot gas nozzle, can push aside the flexible hot gas nozzle, which is embodied as a helical spring, in accordance with the invention, without damaging it. This is in particular also true for the central support of the transporting appliance, with which the circuit boards are transported through the hot gas area.

The circuit board surface can thus, for instance, be positioned at a location very close to the nozzle plate having the hot gas nozzles embodied in accordance with the invention even when a central support is present or when other disruptive contours are present in the area of the circuit board surface or the hot gas nozzles, the desired direct heat transfer ensuing with only very small losses of energy. As the applicant has discovered in experiments, thanks to the hot gas nozzles being embodied as helical springs in accordance with the invention, the same amount of heat can be transferred in this manner onto the circuit boards as with a nozzle plate having rigid hot gas nozzles and thereby having a larger distance between the nozzle openings and the circuit boards or soldering points to be heated, the energy being significantly reduced, sometimes up to half of the original amount.

Even while a central support for the circuit boards is operated or is advanced more or less transversely with respect to the direction of transport of the circuit boards for adjustment, an increased distance from the nozzle plate having the hot gas nozzles does not have to be kept anymore thanks to the invention. Instead, the central support can be operated or advanced despite a potential collision with the hot gas nozzles since the same are embodied, in accordance with the invention, as resilient helical springs.

The hot gas nozzle embodied as a helical spring can transport the hot gas particularly efficiently to the nozzle outlet when the helical spring, as it is envisaged in accordance with a particularly preferred embodiment of the invention, is a tension spring wound to block thickness. This means that the windings of the helical spring, in the forcefree state of the helical spring, directly rest on top of one another, whereby the hot gas is inhibited from exiting to the side between the windings of the helical spring.

The invention is furthermore realized independently of how the helical spring and the nozzle plate are connected to each other. In accordance with a particularly preferred embodiment, the helical spring, however, penetrates its assigned drilled hole of the nozzle plate and preferably has been pressed into the drilled hole of the nozzle plate. In this manner, the hot gas nozzles embodied as helical springs can easily and rapidly be mounted on the nozzle plate.

In accordance with an embodiment alternative to the above, the drilled hole of the nozzle plate features a thread concurrent with the helical spring in terms of its diameter and its lead. This embodiment makes it possible that the helical spring can easily be screwed into the nozzle plate, without additional elements for fastening or fixing being required.

Another embodiment of the invention envisages that the drilled hole of the nozzle plate, in the area of the runout on the side of the helical spring, is widened in a conical or rounded fashion. In this manner, stress peaks upon deflection of the helical springs in the case of a collision, for instance with the central support of the soldering installation, are avoided, and the durability of the helical springs is thus increased.

According to a further possible embodiment of the invention, it is ultimately envisaged that the helical spring, in the area of the hot gas outlet, is shaped so as to be tapered in a conical fashion or in the shape of a nozzle. In this manner, the heat transfer through the stream of hot gas onto the circuit board is effected in an even more effective manner.

Hereinafter, the invention will be explained with the help of drawings only illustrating exemplary embodiments.

Figure 2:
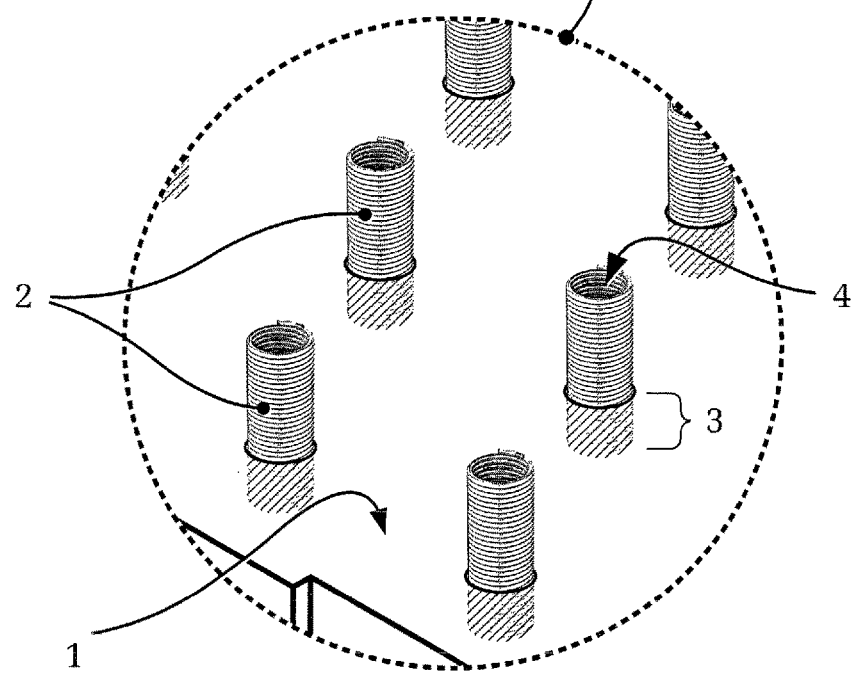
Figure 3:
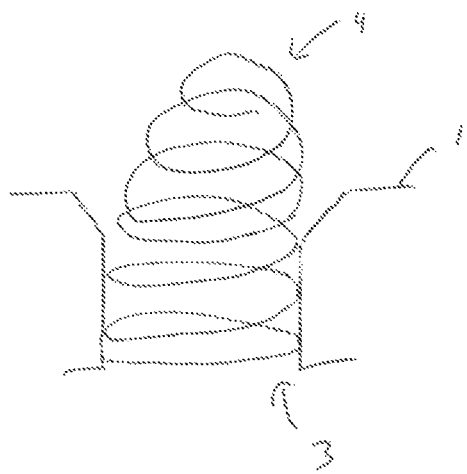
Figure 4:
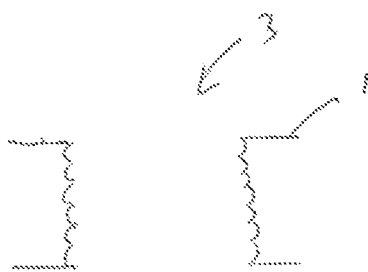

In the figures:

FIG. 1, in a schematic isometric illustration, shows a nozzle plate having hot gas nozzles in accordance with an exemplary embodiment of the present invention;

FIG. 2, in an enlarged detail illustration, shows an area of the nozzle plate in accordance with FIG. 1, with a number of hot gas nozzles;

FIG. 3, in a cross section, shows an embodiment of a drilled hole including an area of a runout on a side of the helical spring that is widened in a conical or rounded fashion; and FIG. 4, in a cross section, shows an embodiment of a drilled hole including a thread concurrent with the helical spring in terms of its diameter and its lead, for receiving the helical spring.

In FIG. 1, a schematically illustrated nozzle plate 1 having a plurality of hot gas nozzles 2 can be seen. The nozzle plate 1 can be arranged in a soldering machine, for instance beneath the printed circuit boards to be transported through the soldering machine, in such a fashion that the stream of hot gas exiting from the nozzle openings 4 to the top (relating to the drawing) heats the soldering points at the circuit boards and leads to the desired melting of the solder.

FIG. 2 shows the hot gas nozzles 2 embodied as helical springs in accordance with the invention in an enlarged detail illustration. It can be seen that more or less one third of the hot gas nozzles 2, in an overlap area, is set in corresponding drilled holes 3 of the nozzle plate 1, for instance has been screwed into corresponding threads.

This means that mounting the nozzle plate having the elastic hot gas nozzles in accordance with the invention only causes correspondingly low effort and costs. Simultaneously, the hot gas feed device in accordance with the invention, obtained in this manner, is particularly robust during operation since collisions of the hot gas nozzles 2 with other groups of components of the soldering installation cannot cause damage anymore. As a whole, the solution of the problem in accordance with the invention thus ensues, in particular an improved heat transfer or a considerably lower energy absorption while the heat transfer is the same, due to the reduced distances rendered possible with the aid of the invention, between the nozzle openings 4 and the circuit boards or soldering points to be heated.

FIG. 3 shows a further embodiment of the invention in which the drilled hole 3 of the nozzle plate 1 is widened conically or rounded in the region of the helical spring-side outlet. In this way, voltage spikes during the deflection of the coil springs in the event of collision, for example, with the center support of the soldering system is avoided, and the service life of the coil springs is thus increased.

In addition, a helical spring such as shown in FIG. 3, including, in the area of a hot gas outlet at a distal end of the helical spring, can shaped so as to be tapered in a conical fashion or in the shape of a nozzle. In this manner, the heat transfer through the stream of hot gas onto the circuit board is effected in an even more effective manner. Advantageously, a helical spring as shown in FIG. 3 can be used with any embodiments disclosed herein without departing from the scope of the invention.

LIST OF REFERENCE NUMERALS

1 nozzle plate
2 hot gas nozzle, helical spring
3 drilled hole, overlap area
4 nozzle opening

The invention claimed is:

1. A device for feeding a stream of hot gas to a printed circuit board in a soldering machine, the device comprising:
   a nozzle plate having a plurality of drilled holes and
   a plurality of helical springs arranged on the nozzle plate, each helical spring forming a hot gas nozzle, wherein the drilled holes open into the hot gas nozzles.

2. The feed device according to claim 1, in which the helical spring is a tension spring wound to block thickness.

3. The feed device according to claim 1, in which the helical spring penetrates the drilled hole of the nozzle plate.

4. The feed device according to claim 1, in which the helical spring is pressed into the drilled hole of the nozzle plate.

5. The feed device according to claim 1, in which the drilled hole of the nozzle plate includes a thread concurrent with the helical spring in terms of its diameter and its lead, for receiving the helical spring.

6. The feed device according to claim 1, in which the drilled hole of the nozzle plate, in an area of a runout on a side of the helical spring, is widened in a conical or rounded fashion.

7. The feed device according to claim 1, in which a distal end of the helical spring defines a hot gas outlet, and that the helical spring, in an area of the hot gas outlet is tapered in a conical fashion.

* * * * *